(12) United States Patent
Ting et al.

(10) Patent No.: US 10,862,064 B1
(45) Date of Patent: Dec. 8, 2020

(54) ORGANIC LIGHT EMITTING DIODE (OLED) DISPLAY PANEL WITH REFLECTIVE ELECTRODE

(71) Applicant: AU OPTRONICS CORPORATION, Hsin-Chu (TW)

(72) Inventors: Yung-Sheng Ting, Hsin-Chu (TW); Yu-Ching Wang, Hsin-Chu (TW); Yi-Hui Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/863,643

(22) Filed: Apr. 30, 2020

(51) Int. Cl.
*H01L 51/52* (2006.01)
*H01L 27/32* (2006.01)

(52) U.S. Cl.
CPC ...... *H01L 51/5218* (2013.01); *H01L 27/3246* (2013.01); *H01L 51/5209* (2013.01); *H01L 2251/301* (2013.01); *H01L 2251/308* (2013.01); *H01L 2251/5315* (2013.01); *H01L 2251/558* (2013.01)

(58) Field of Classification Search
CPC .................................................. H01L 51/5218
USPC ......................................................... 257/40
See application file for complete search history.

(56) References Cited

U.S. PATENT DOCUMENTS

| 2011/0229994 | A1* | 9/2011 | Jung ..................... H01L 51/56 438/29 |
| 2013/0134570 | A1* | 5/2013 | Nishido .............. H01L 51/5243 257/680 |
| 2018/0102498 | A1* | 4/2018 | Shin ..................... G09G 3/3233 |

FOREIGN PATENT DOCUMENTS

| CN | 103050507 B | 3/2016 |
| CN | 106775167 A | 5/2017 |
| CN | 108807719 A | 11/2018 |

* cited by examiner

*Primary Examiner* — Ajay Arora
(74) *Attorney, Agent, or Firm* — Tim Tingkang Xia, Esq.; Locke Lord LLP

(57) ABSTRACT

An organic light emitting diode (OLED) display panel includes a substrate, a reflective electrode disposed on the substrate, and a pixel define layer (PDL) formed on the substrate and the reflective electrode layer. The reflective electrode layer has multiple reflective structures, and each reflective structure has a first region and a second region. The PDL is provided with multiple openings corresponding to the reflective structures, such that the first region and the second region of each of the reflective structures are exposed in a corresponding one of the openings. Multiple organic emissive structures are correspondingly formed in the openings and covering the reflective structures, forming a plurality of pixels. For each respective pixel of the pixels, a first reflective ratio of the respective pixel corresponding to the first region is greater than a second reflective ratio of the respective pixel corresponding to the second region.

18 Claims, 15 Drawing Sheets

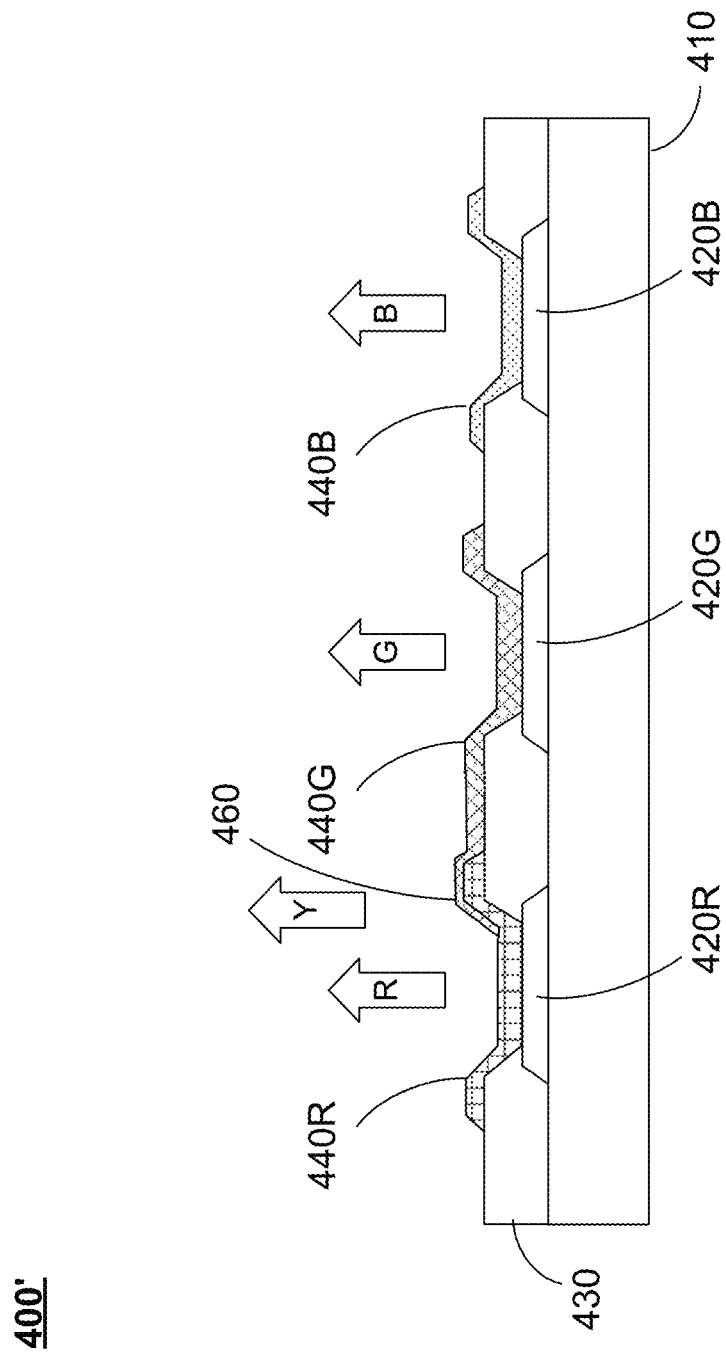

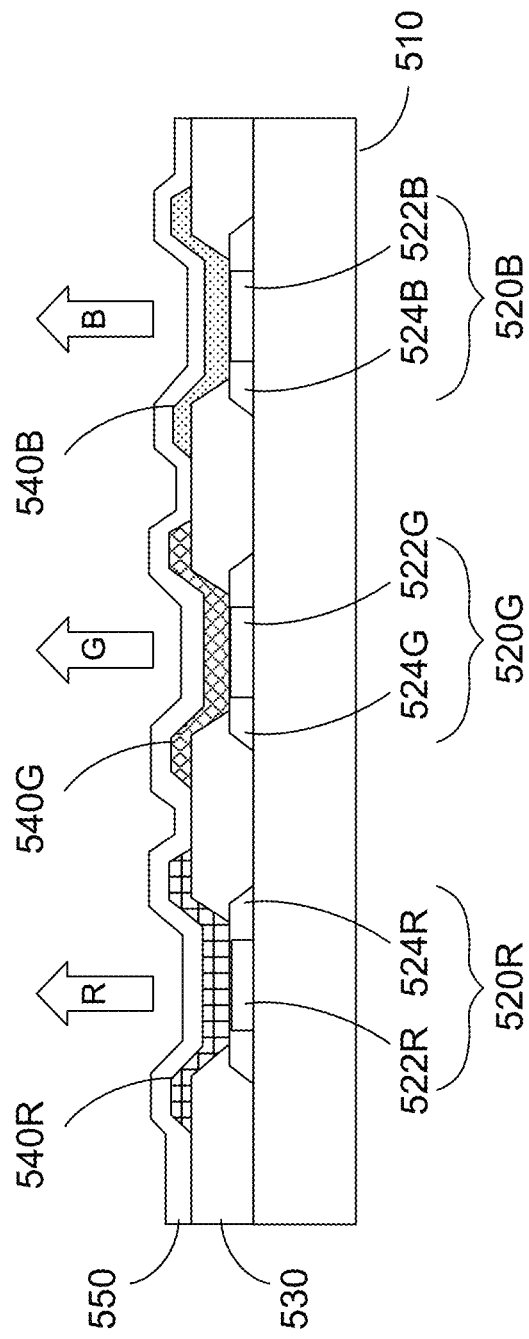

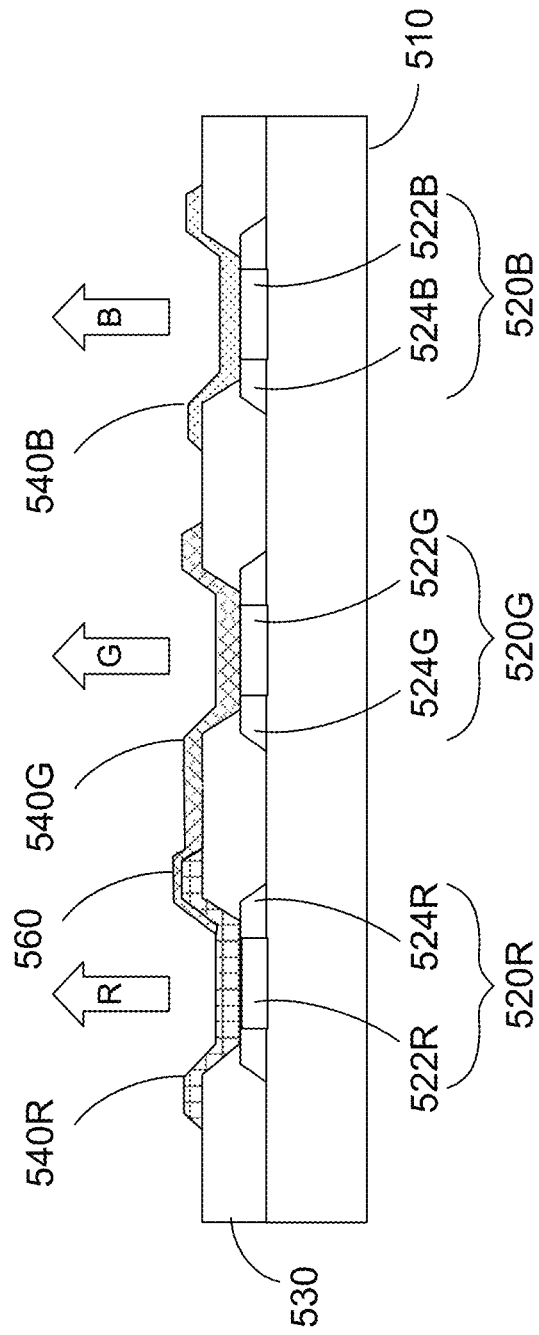

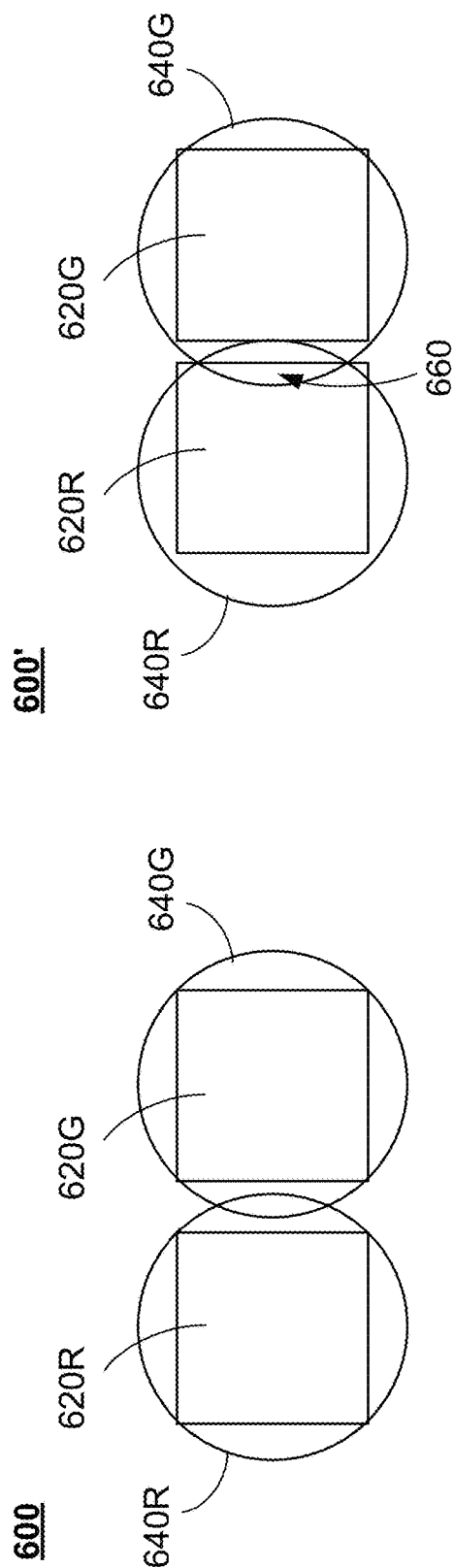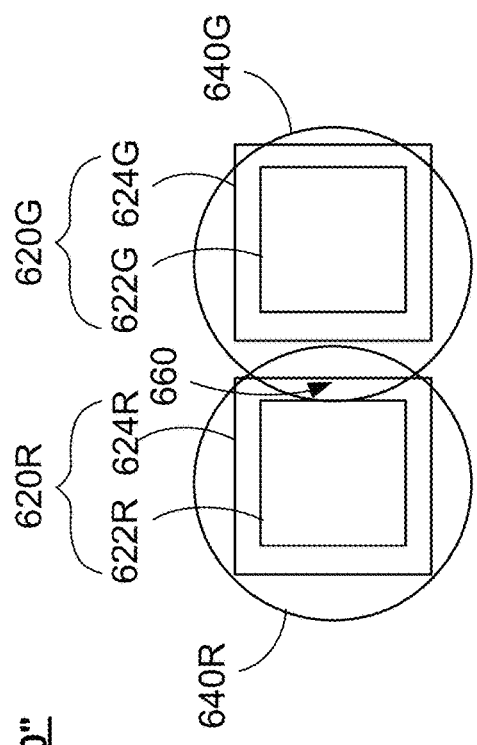

ORGANIC LIGHT EMITTING DIODE (OLED) DISPLAY PANEL WITH REFLECTIVE ELECTRODE

FIELD

The disclosure relates generally to display technology, and more particularly to an organic light emitting diode (OLED) display panel that solves.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, organic light emitting diode (OLED) display panels are widely used in mobile devices such as cell phones or tablet devices. In some cases, the OLED display panel may be an active matrix OLED (AMOLED) display panel, which is used in a device that require a higher resolution, such as in a virtual reality (VR) device. With the resolution of the OLED display panel being increased, the size of each emissive structure in an emissive layer of the OLED display panel may be small, and accurate coating alignment for the emissive structures may become more difficult.

Therefore, a heretofore unaddressed need exists in the art to address the aforementioned deficiencies and inadequacies.

SUMMARY

One aspect of the disclosure relates to an organic light emitting diode (OLED) display panel, which includes: a substrate; a reflective electrode layer disposed on the substrate and having a plurality of reflective structures, wherein each of the reflective structures has a first region and a second region; a pixel define layer (PDL) formed on the substrate and the reflective electrode layer, wherein the PDL is provided with a plurality of openings corresponding to the reflective structures, such that the first region and the second region of each of the reflective structures are exposed in a corresponding one of the openings; and a plurality of organic emissive structures correspondingly formed in the openings and covering the reflective structures, forming a plurality of pixels, wherein for each respective pixel of the pixels, a first reflective ratio of the respective pixel corresponding to the first region is greater than a second reflective ratio of the respective pixel corresponding to the second region.

In certain embodiments, the OLED display panel has a total reflective ratio greater than or equal to 80%.

In certain embodiments, a first area ratio of the first region is X of a total area of each of the reflective structures, a second area ratio of the second region is (1-X) of the total area of each of the reflective structures, and X is greater than or equal to 80% and less than or equal to 99%.

In certain embodiments, for each of the reflective structures, a difference between the first reflective ratio of the first region and the second reflective ratio of the second region is greater than or equal to 1%.

In certain embodiments, for each of the reflective structures, the first region and the second region are formed with a same material and have different thicknesses, such that the first reflective ratio of the first region is greater than the second reflective ratio of the second region.

In certain embodiments, the material is selected from a group consisting of Ag, Al, Mg and Mo, and a first thickness of the first region is greater than a second thickness of the second region.

In certain embodiments, for each of the reflective structures, the first region and the second region are formed with different materials and have a same thickness, such that the first reflective ratio of the first region is greater than the second reflective ratio of the second region.

In certain embodiments, each of the different materials is selected from a group consisting of Ag, Al, Mg and Mo.

In certain embodiments, the first region is surrounded by the second region.

In certain embodiments, the second region is divided into two separate areas by the first region.

In certain embodiments, a thickness of each of the reflective structures is less than or equal to 100 nm.

In certain embodiments, for each of the reflective structures, a thickness of the first region is less than or equal to 100 nm and greater than or equal to 40 nm.

In certain embodiments, each of the reflective structures further has a third region between the first region and the second region, and for each respective pixel of the pixels, a third reflective ratio of the respective pixel corresponding to the third region is greater than the second reflective ratio and less than the first reflective ratio.

In certain embodiments, the OLED display panel has a resolution greater than 600 pixels per inch (ppi).

In certain embodiments, the reflective structures in function as anodes of the pixels, and each of the reflective structures is respectively covered and sandwiched by two transparent layers. In one embodiment, the transparent layers are indium tin oxide (ITO) layers.

In certain aspects of the disclosure, a device may have the OLED display panel as discussed above. In certain embodiment, the device may be a virtual reality (VR) device.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 4C schematically shows a sectional view of the OLED display panel in FIG. 4A, in which the organic emissive structure of the green (G) pixel shifts and partially overlaps with the organic emissive structure of the red (R) pixel.

FIG. 5A schematically shows a sectional view of an OLED display panel according to certain embodiments of the present disclosure, in which each reflective structure has two regions.

FIG. 5C schematically shows a sectional view of the OLED display panel in FIG. 5A, in which the organic emissive structure of the green (G) pixel shifts and partially overlaps with the organic emissive structure of the red (R) pixel.

FIG. 6A schematically shows a top view of the organic emissive structures and the reflective structures of two adjacent pixels of an OLED display panel according to certain embodiments of the present disclosure.

FIG. 6B schematically shows a top view of the organic emissive structures and the reflective structures of two adjacent pixels of an OLED display panel according to certain embodiments of the present disclosure, in which the organic emissive structure of the green (G) pixel shifts and partially overlaps with the organic emissive structure of the red (R) pixel.

FIG. 6C schematically shows a top view of the organic emissive structures and the reflective structures of two adjacent pixels of an OLED display panel according to certain embodiments of the present disclosure, in which each reflective structure has two regions, and the organic emissive structure of the green (G) pixel shifts and partially overlaps with the organic emissive structure of the red (R) pixel.

DETAILED DESCRIPTION OF THE DISCLOSURE

Figure 1A:
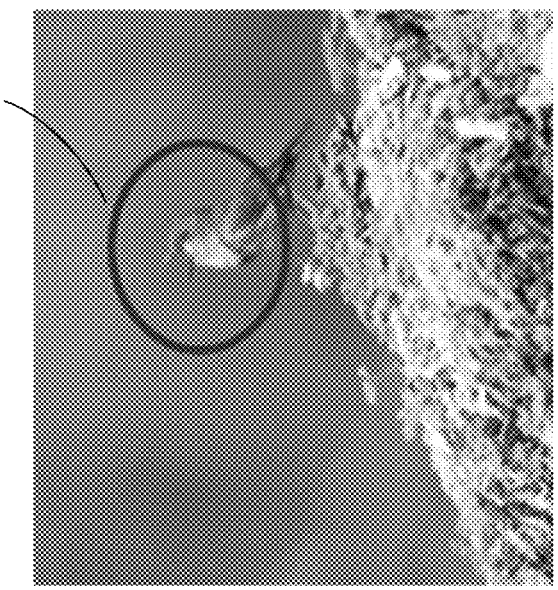
FIG. 1A schematically shows an image displayed by an OLED display panel according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Unless otherwise specified, the term "reflective ratio" as used herein refers to a relative reflective ratio using the actual reflective ratio of a layer of silver (Ag) having a thickness of 100 nm or more as the basis. Specifically, the actual reflective ratio of the Ag layer having a thickness over 100 nm reaches a stably high ratio substantially close to 100%. Thus, using the actual reflective ratio of the Ag layer over 100 nm as the basis, the "reflective ratio" as used herein would be approximately similar to the actual reflective ratio.

The description will be made as to the embodiments of the present disclosure in conjunction with the accompanying drawings. In accordance with the purposes of this disclosure, as embodied and broadly described herein, this disclosure, in certain aspects, relates to an OLED display panel having a specific design for its reflective structures of a reflective electrode layer, such that each pixel of the OLED display panel may have two different reflective ratios in two regions of the corresponding reflective structure.

Figure 1B:
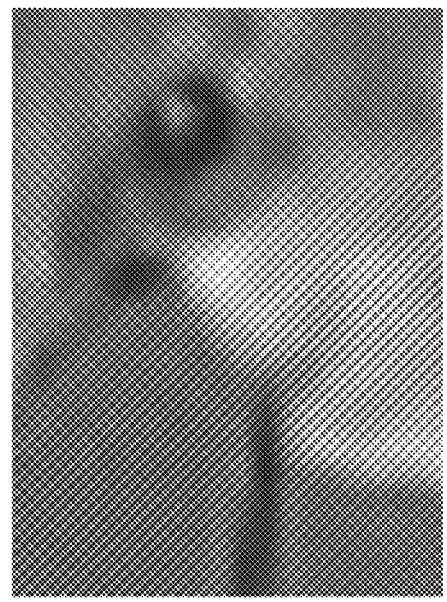
FIG. 1B schematically shows a partially enlarged view of the image in FIG. 1A.

As discussed above, an OLED display panel, such as an AMOLED display panel, may be used in a device that require a higher resolution Currently, the resolution of a typical AMOLED display panel may be in a range of 400-600 pixels per inch (ppi). However, in some cases where the image being displayed on the AMOLED display panel is enlarged, the resolution may be considered low. For example, FIG. 1A schematically shows an image 100 displayed by an OLED display panel according to certain embodiments of the present disclosure, and FIG. 1B schematically shows a partially enlarged view of the image in FIG. 1A. Specifically, the image 100 as shown in FIG. 1A is a VR image, where a distance of the VR image 100 is about 20-30 cm from the user eyes, and FIG. 1B shows an enlarged view of the VR image 100, where the distance of the enlarged view 120 is about 6 cm from the user eyes. As shown in FIG. 1B, the enlarged view 120 of the image 100 shows a grainy mesh pattern, which is apparently observable to human eyes. Since a user may frequently use the magnifying function to enlarge the VR images in the VR application, the resolution of the OLED display panel must be increased to avoid the significant grainy mesh pattern issue.

Figure 2:
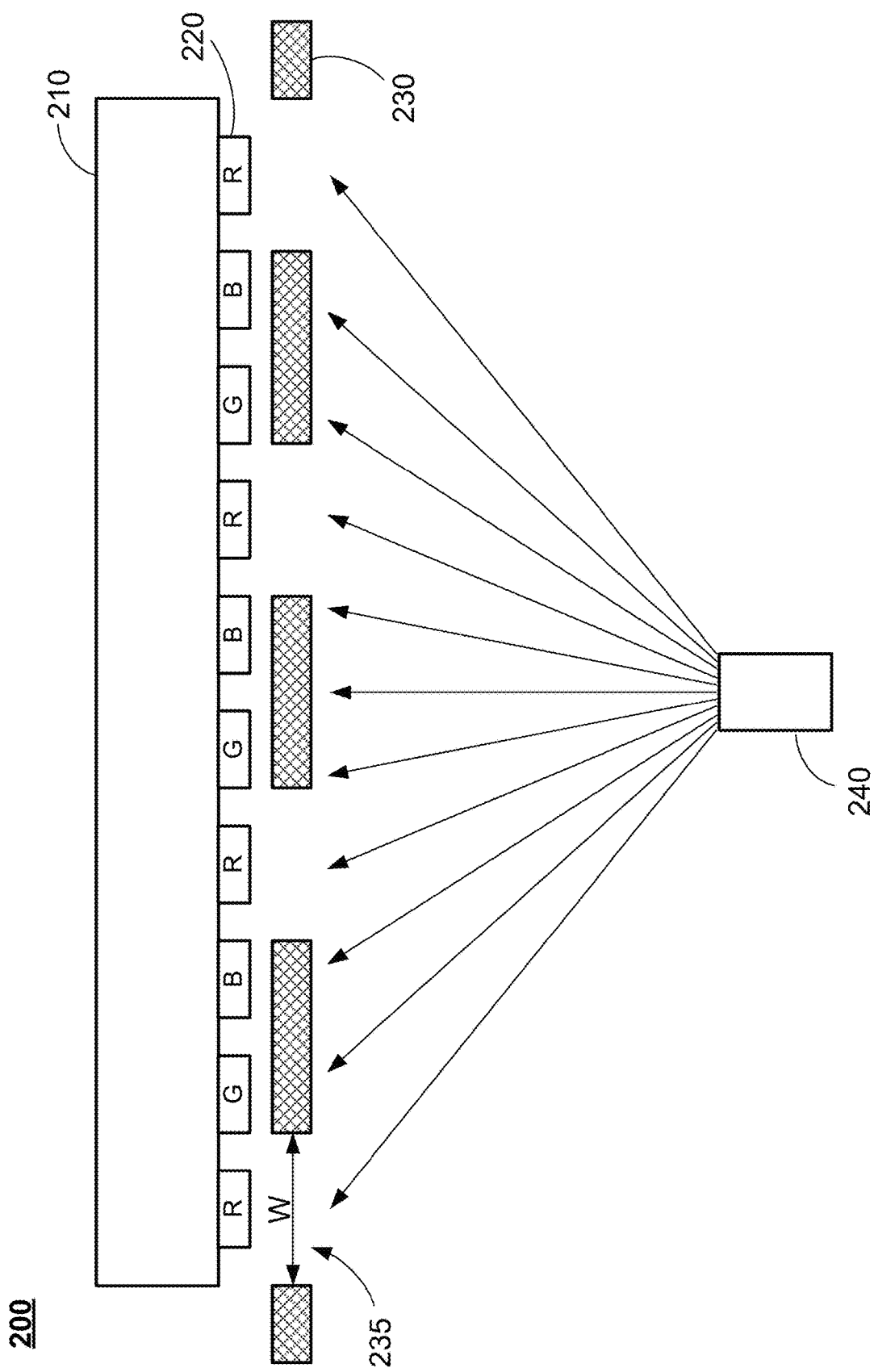
FIG. 2 schematically shows a vacuum deposition process of the emissive layers of an OLED panel according to certain embodiments of the present disclosure.

However, to manufacture an OLED display panel with a higher resolution, the pixel size of the OLED display panel must be reduced. For example, FIG. 2 schematically shows a vacuum deposition process of the emissive layers of an OLED display panel according to certain embodiments of the present disclosure. Specifically, the vacuum deposition process is a part of the manufacturing process of the OLED display panel. In the process as shown in FIG. 2, an emissive layer 220 (i.e., a pixel layer) is deposited on a substrate 210 by vacuum deposition using a fine mask shadow mask (FMM) 230 and a vacuum source 240. As shown in FIG. 2, the emissive layer 220 includes multiple emissive structures in RGB colors, and the mask openings 235 of the FMM 230 are aligned to the emissive structures in the red (R) color. Thus, all of the emissive structures in the red (R) color are formed altogether in one step of the vacuum deposition process, and the emissive structures in the green (G) color and the emissive structures in the blue (B) color require two more respective steps of the vacuum deposition process.

In the vacuum deposition process using the FMM 230 as shown in FIG. 2, two major factors are involved as the restrictions to the vacuum deposition process: (1) the size of each mask opening 235 of the FMM 230, and (2) the alignment of the mask openings 235 of the FMM 230 to the intended positions of the corresponding emissive structures in the emissive layer 220 on the substrate 210. With a higher resolution of the OLED display panel being required, the size of each emissive structure in the emissive layer 220 may be small. Since the size of each emissive structure in the emissive layer 220 is determined by the size of each mask opening 235 of the FMM 230, the size of each mask opening 235 of the FMM 230 is also correspondingly reduced. Thus, a slight deviation of the FMM 230 from its intended location in the vacuum deposition process may cause the emissive structures in one color to shift from their corresponding positions on the substrate 210. Thus, accurate coating alignment for the emissive structures in the emissive layer 220 may become more difficult.

Figure 3A:
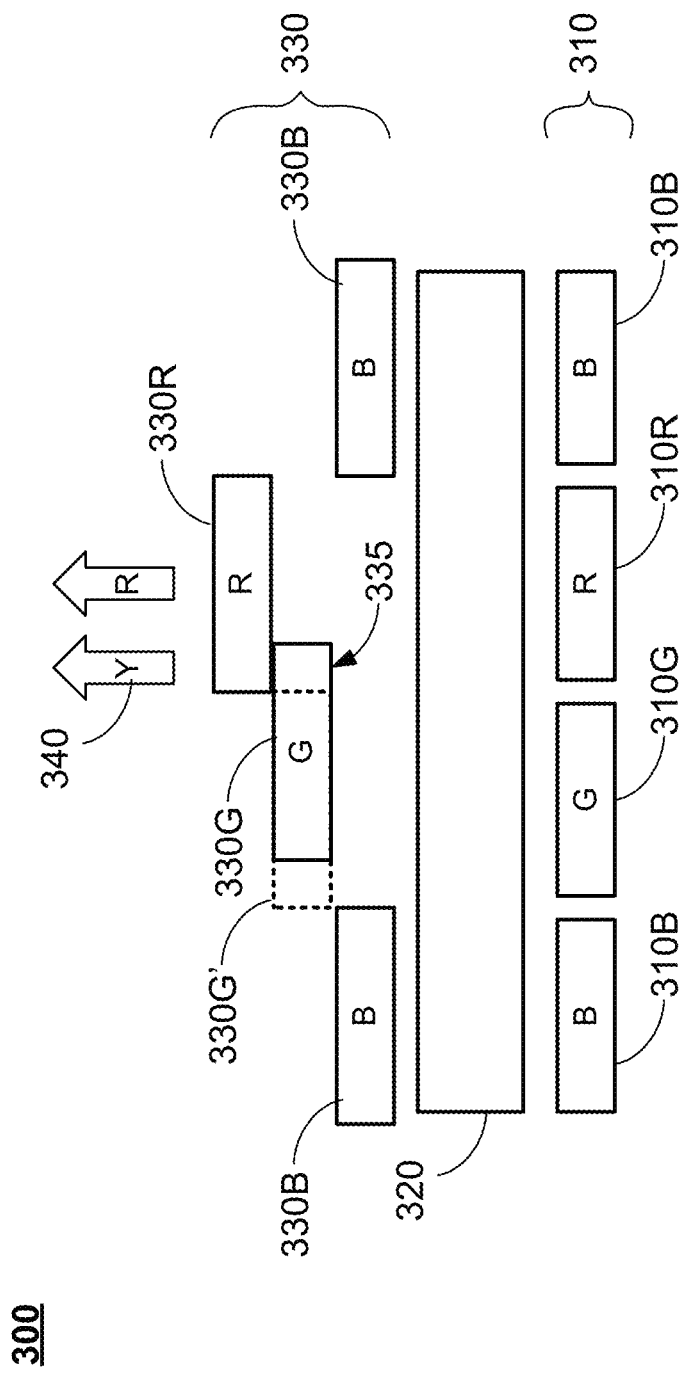
FIG. 3A schematically shows an OLED display panel according to certain embodiments of the present disclosure, in which the G emissive structure overlaps with the adjacent R emissive structure.
Figure 3B:
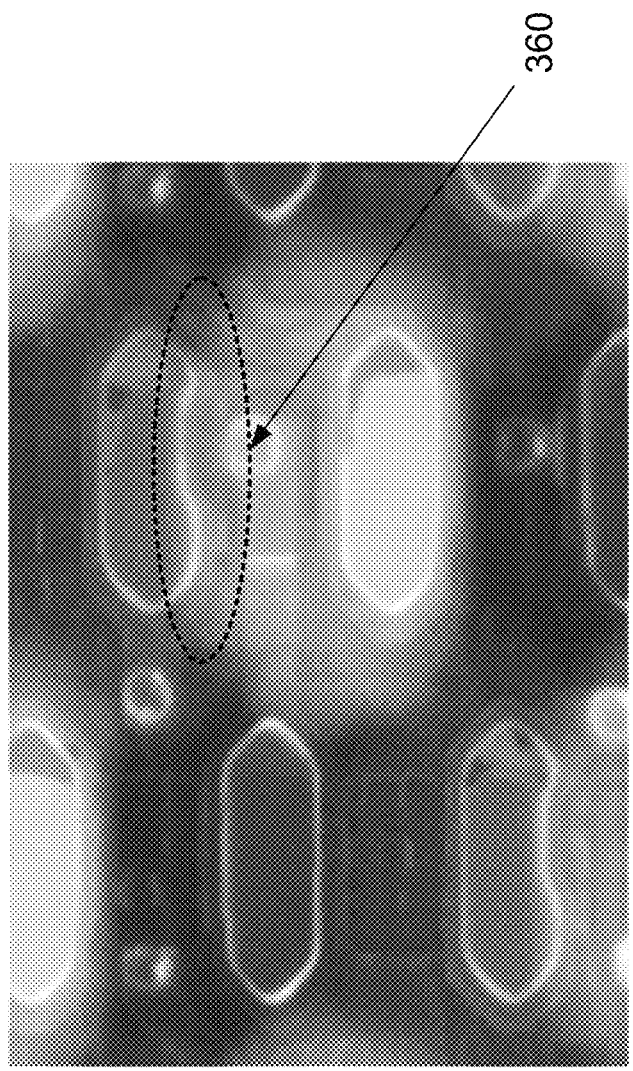
FIG. 3B shows emission of an OLED display panel with mixing of R/G colors according to certain embodiments of the present disclosure.

When some of the emissive structures in the emissive layer 220 shift from their intended positions on the substrate 210, a portion of the shifted emissive structures may overlap with their adjacent emissive structures. For example, FIG. 3A schematically shows an OLED display panel according to certain embodiments of the present disclosure, in which the G emissive structure overlaps with the adjacent R emissive structure. As shown in FIG. 3A, the OLED display panel 300 includes a hole injection layer (HIL) 310, a hole transport layer (HTL) 320, and an emissive layer 330 (i.e., the pixel layer) including multiple emissive structures 330R, 330G and 330B. Specifically, the HIL 310 and the HTL 320 are optional structures, and in certain embodiments, the OLED display panel 300 may include only one of the HIL 310 and the HTL 320. As shown in FIG. 3A, the HIL 310 includes a plurality of HIL structures 310R, 310G and 310B corresponding to the emissive structures 330R, 330G and 330B. Further, the emissive structures in the emissive layer 330 are shown in different rows to illustrate the shift of the green (G) emissive structure 330G. In the emissive layer 330, the blue (B) emissive structures 330B and the red (R) emissive structure 330R are respectively located in their respective positions. However, the green (G) emissive structure 330G shifts rightward from its intended position 330G' (shown in dotted line), thus forming an overlapping area 335 with the adjacent red (R) emissive structure 330R. Thus, the light emitted in the overlapping area 335 is a mix of light in the R/G colors, which becomes a yellow (Y) light 340. FIG. 3B shows emission of an OLED display panel with mixing of R/G colors according to certain embodiments of the present disclosure, in which the emission of the overlapping area 360 shows a yellow pattern due to the upward shift of the green (G) emissive structure.

Figure 4A:
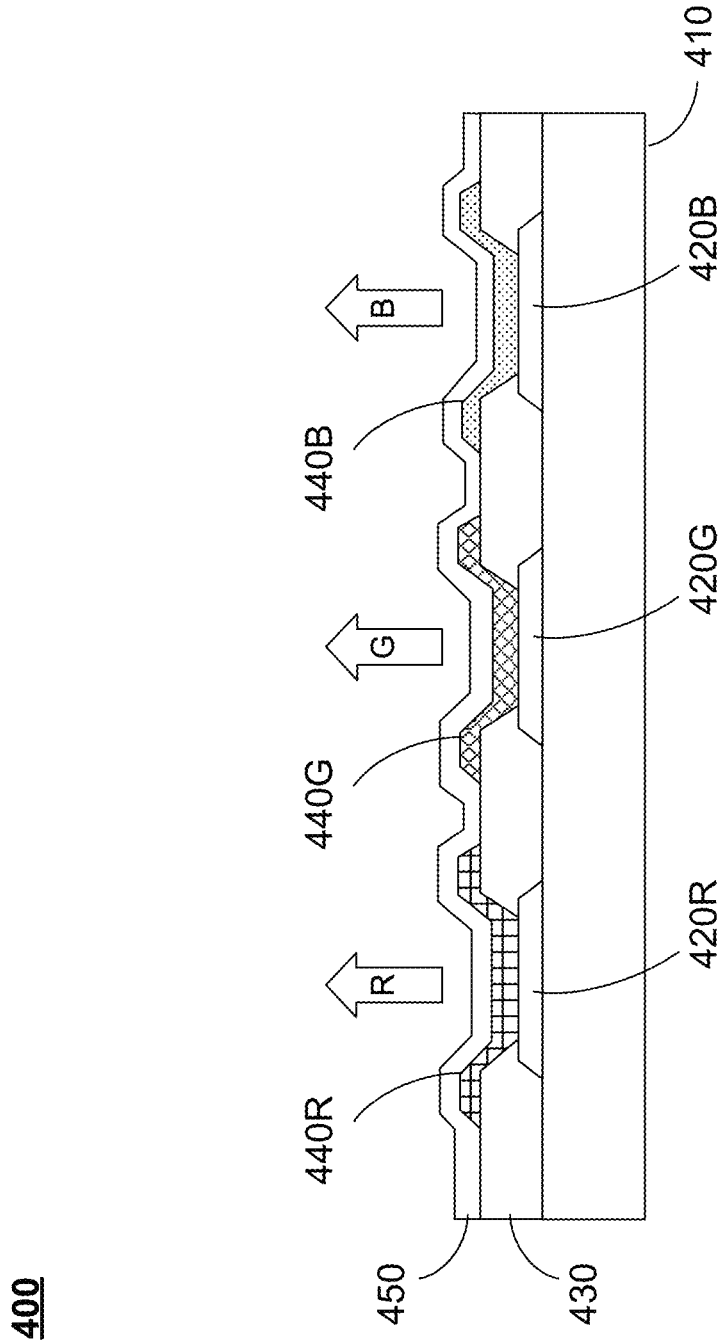
FIG. 4A schematically shows a sectional view of an OLED display panel according to certain embodiments of the present disclosure.

FIG. 4A schematically shows a sectional view of an OLED display panel according to certain embodiments of the present disclosure. As shown in FIG. 4A, the OLED display panel 400 includes a substrate 410, a reflective electrode layer having multiple reflective structures 420R, 420G and 420B, a pixel define layer (PDL) 430, a plurality of organic emissive structures 440R, 440G and 440B, and a transparent electrode 450. The reflective electrode layer is disposed on the substrate 410.

Figure 4B:
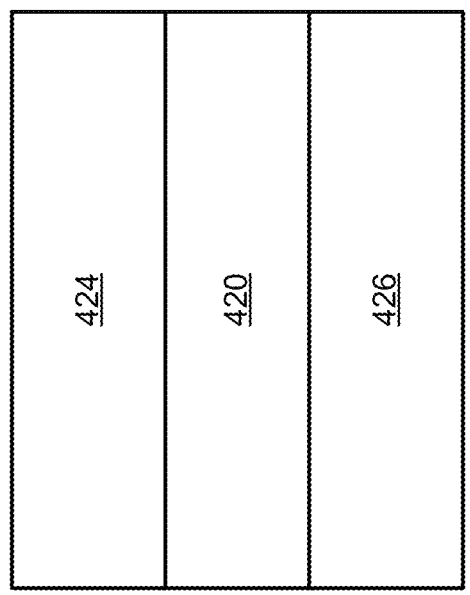
FIG. 4B schematically shows a sectional view of a reflective structure of the OLED display panel in FIG. 4A.

As shown in FIG. 4A, the reflective structures 420R, 420G and 420B are disposed on the substrate 410. FIG. 4B schematically shows a sectional view of a reflective structure of the OLED display panel in FIG. 4A. As shown in FIG. 4B, the reflective structure 420 is respectively covered and sandwiched by two transparent layers 424 and 426, thus forming a sandwiched structure. The transparent layers 424 and 426 may be indium tin oxide (ITO) layers, and each of the transparent layers 424 and 426 is relatively thin in comparison to the reflective structure 420 such that the reflective ratio of the reflective structure 420 is not significantly affected by the transparent layers 424 and 426.

Referring back to FIG. 4A, the PDL 430 is formed on the substrate 410 and the reflective electrode layer. The PDL 430 is provided with a plurality of opening corresponding to the reflective structures 420R, 420G and 420B, and the organic emissive structures 440R, 440G and 440B are correspondingly formed in the openings and covering the reflective structures 420R, 420G and 420B. In certain embodiments, each reflective structure may be directly in contact with the corresponding organic emissive structure. Alternatively, in certain embodiments, there may be other films or layers (such as the HIL, HTL or other layers) between each reflective structure and the corresponding organic emissive structure such that each reflective structure is not directly in contact with the corresponding organic emissive structure. The transparent electrode 450 is disposed on the PDL 430 and the organic emissive structures 440R, 440G and 440B. The structures collectively form a plurality of OLED pixels, in which each of the reflective structures functions as an anode of the corresponding pixel, and the transparent electrode 450 functions as the cathode for each of the pixels.

As discussed above, when some of the organic emissive structures 440R, 440G and 440B shift from their intended positions, a portion of the shifted organic emissive structures may overlap with their adjacent organic emissive structures. For example, FIG. 4C schematically shows a sectional view of the OLED display panel in FIG. 4A. As shown in FIG. 4C, the organic emissive structure 440G of the green (G) pixel shifts leftward and partially overlaps with the organic emissive structure 440R of the red (R) pixel, forming an overlapping area 460. Further, the transparent electrode 450 in FIG. 4C is removed to better illustrate the overlapping area 460. The mix of light in the R/G colors in the overlapping area 460 between the organic emissive structures 440R and 440G may results in the unwanted yellow pattern as shown in FIG. 3B.

In order to solve the unwanted mixing color patterns caused by the shift of the organic emissive structures, one aspect of the disclosure relates to an OLED display panel, in which each reflective structure has multiple regions with different reflective ratios. Specifically, the reflective ratio of a first region of each reflective structure which does not correspond to the overlapping area is greater than the reflective ratio of a second region of each reflective structure corresponding to the overlapping area, such that the reflective ratio of each pixel corresponding to the second region may be reduced, thus reducing the unwanted mixing color patterns. In certain embodiments, for each of the reflective structures, a difference between the reflective ratio of the first region and the reflective ratio of the second region is greater than or equal to 1%, such that the human eyes may detect the difference between the luminance corresponding to the first region and the second region.

FIG. 5A schematically shows a sectional view of an OLED display panel according to certain embodiments of the present disclosure, in which each reflective structure has two regions. As shown in FIG. 5A, the OLED display panel 500 includes a substrate 510, a reflective electrode layer having multiple reflective structures 520R, 520G and 520B, a PDL 530, a plurality of organic emissive structures 540R, 540G and 540B, and a transparent electrode 550. Specifically, the difference between the OLED display panel 500 as shown in FIG. 5A from the OLED display panel 400 as shown in FIG. 4A exists in that each of the reflective structures 520R, 520G and 520B has two regions. Specifically, the reflective structure 520R has a first region 522R and a second region 524R, the reflective structure 520G has a first region 522G and a second region 524G, and the reflective structure 520B has a first region 522B and a second region 524B. Other structures of the OLED display panel 500, including the substrate 510, the PDL 530, the organic emissive structures 540R, 540G and 540B, and the transparent electrode 550, are similar to the corresponding structures of the OLED display panel 400 as shown in FIG. 4A, and are thus not elaborated herein.

Figure 5B:
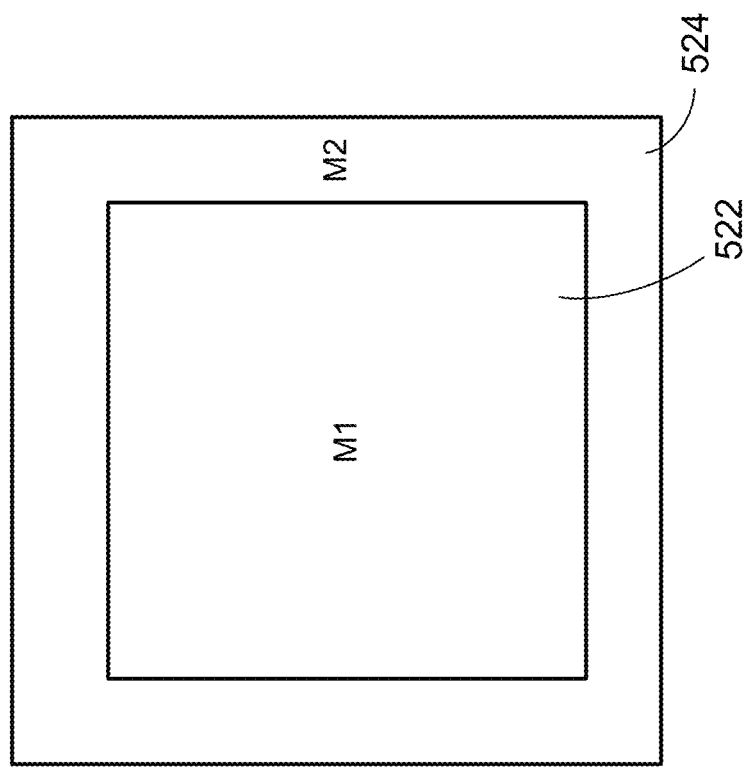
FIG. 5B schematically shows a top view of a reflective structure having two regions in FIG. 5A.

FIG. 5B schematically shows a top view of a reflective structure having two regions in FIG. 5A. As shown in FIG. 5B, the reflective structure 520 is substantively a square-shaped structure, which is divided into a first region (M1) 522 and a second region (M2) 524 surrounding the first region M1, and a first area ratio of the first region M1 is 80% of a total area of the reflective structure 520. In other words, a second area ratio of the second region M2 is 20% of the total area of the reflective structure 520. Further, a first reflective ratio of the first region M1 is greater than a second reflective ratio of the second region M2. For example, if the first reflective ratio of the first region M1 is designated as being 100%, the second reflective ratio of the second region M2 must be less than 100%.

As shown in FIG. 5A, the PDL 530 is provided with a plurality of opening corresponding to the reflective structures 520R, 520G and 520B, such that the first region M1 and the second region M2 of each reflective structure are exposed in the corresponding opening. In certain embodiments, the first region M1 and the second region M2 of each reflective structure are directly in contact with the corresponding organic emissive structure. Alternatively, in certain embodiments, there may be other films or layers (such as the HIL, HTL or other layers) between each reflective structure and the corresponding organic emissive structure, such that the first region M1 and the second region M2 of each reflective structure are not directly in contact with the corresponding organic emissive structure. Further, FIG. 5C schematically shows a sectional view of the OLED display panel in FIG. 5A, in which the organic emissive structure of the green (G) pixel shifts and partially overlaps with the organic emissive structure of the red (R) pixel. As shown in FIG. 5C, the organic emissive structure 540G of the green (G) pixel shifts leftward and partially overlaps with the organic emissive structure 540R of the red (R) pixel, forming the overlapping area 560. However, the reflective structure 520R is divided into the first region 522R and the second region 524R, and the second region 524R aligns vertically with the overlapping area 560. Since the second reflective ratio of the second region 524R is less than 100% (in comparison to the 100% reflective ratio of the first region 522R), the reflective ratio of the R pixel corresponding to the second region 524R will be less than the reflective ratio of the R pixel corresponding to the first region 522R, thus reducing the unwanted yellow pattern.

In the embodiment as shown in FIG. 5B, the first area ratio of the first region M1 is 80% of the total area of the reflective structure 520, and the second area ratio of the second region M2 is 20% of the total area of the reflective structure 520. In certain embodiments, the first area ratio of the first region M1 and the second area ratio of the second region M2 can be varied. For example, the first area ratio of the first region M1 can be X of the total area of the reflective structure 520, where X is greater than or equal to 80% and less than or equal to 99%. In this case, the second area ratio of the second region M2 is (1-X) of the total area of the reflective structure 520.

FIGS. 6A, 6B and 6C schematically show multiple examples of the organic emissive structures and the reflective structures of two adjacent pixels of an OLED display panel according to certain embodiments of the present disclosure. Specifically, in each of FIGS. 6A, 6B and 6C, the two adjacent pixels are respective a R pixel and a G pixel, and the reflective structures 620G and 620R are substantially square-shaped structures. As shown in FIG. 6A, in the pixel structure 600, the organic emissive structures 640G and 640R do not shift from their intended positions. Although there is a slight overlapping area between the organic emissive structures 640G and 640R, the overlapping area does not align with any portion of the reflective structures 620G and 620R.

However, in the case where the organic emissive structure 640G shifts leftward, in the pixel structure 600' as shown in FIG. 6B, the overlapping area 660 may align with a portion of the reflective structure 620R, similar to the case as shown in FIG. 4C, and causing unwanted yellow pattern as shown in FIG. 3B.

In order to solve the unwanted mixing color patterns caused by the shift of the organic emissive structures, in the pixel structure 600" as shown in FIG. 6C, the reflective structure 620R has a first region 622R and a second region 624R. Thus, in the case where the organic emissive structure 640G shift leftward, the overlapping area 660 may align with the second region 624R of the reflective structure 620R, similar to the case as shown in FIG. 5C. Since the second reflective ratio of the second region 624R is less than 100% (in comparison to the 100% reflective ratio of the first region 622R), the reflective ratio of the R pixel corresponding to the second region 624R will be less than the reflective ratio of the R pixel corresponding to the first region 622R, thus reducing the unwanted yellow pattern.

In the embodiments as shown in FIG. 6C, the reflective structures 620R and 620G are square-shaped, and the first region is surrounded by the second region. In certain embodiments, however, the shape of the reflective structures and arrangement of the first and second regions may vary. For example, the shape of the reflective structures may be changed based on the shape of the pixels. Further, the arrangement of the first and second regions may be adjusted based on the occurrences and/or the frequency of the shifts of the organic emissive structures. In certain embodiments, if the shifts of the organic emissive structures occur more frequently in a specific direction, the second region may be arranged along this specific direction, instead of surrounding the first region.

Figure 7:
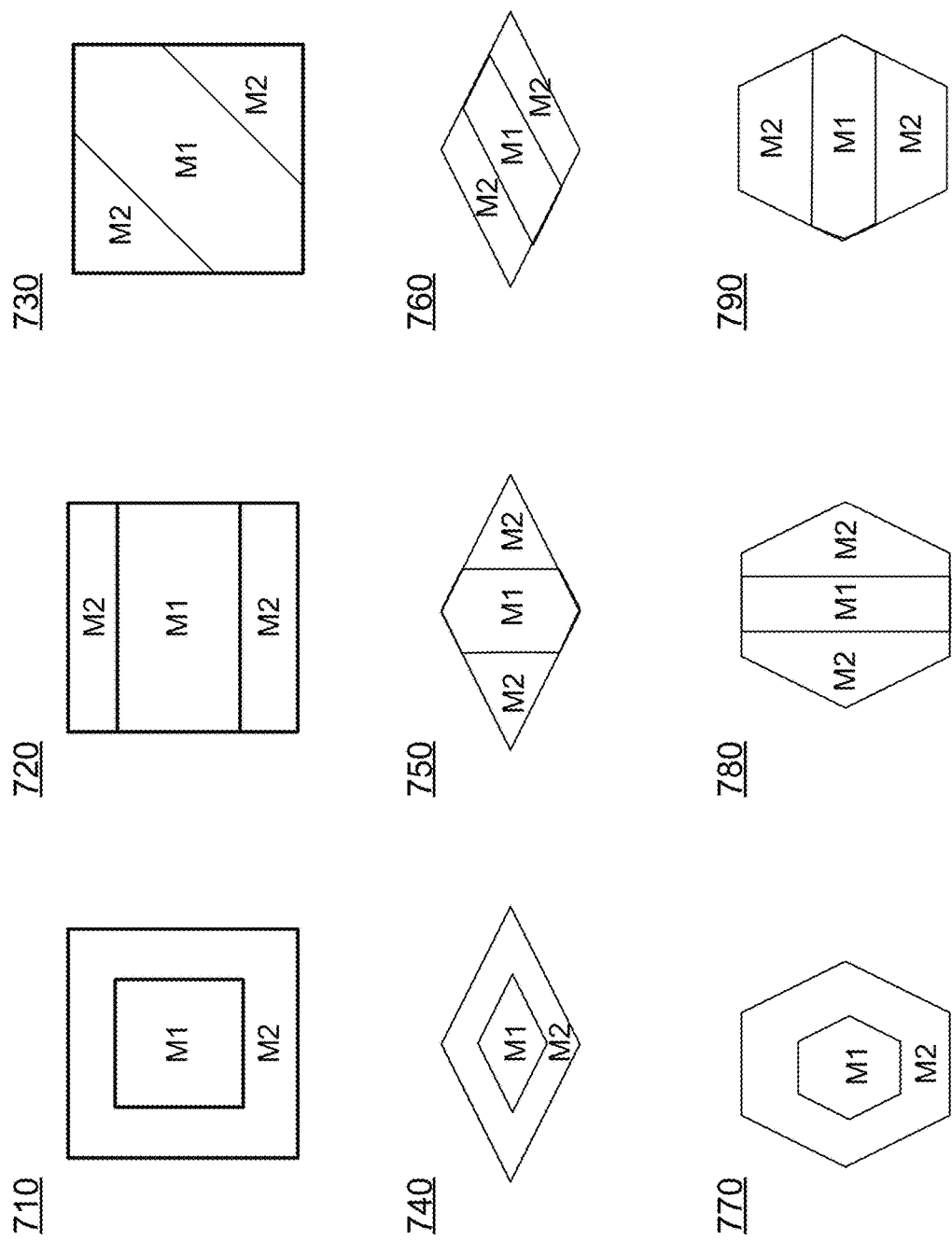
FIG. 7 schematically shows a plurality of reflective structures according to certain embodiments of the present disclosure.

FIG. 7 schematically shows a plurality of reflective structures according to certain embodiments of the present disclosure. Specifically, the reflective structure 710 is identical or similar to each of the reflective structures 620R and 620G. In contrast, the other reflective structures 720-790 are modified to have different shapes and/or different arrangements of the first region M1 and the second region M2. In particular, the reflective structure 720 remains square-shaped, but the arrangement of the first region M1 and the second region M2 is changed to a vertical arrangement, in which the first region M1 divides the second region M2 into an upper area and a lower area separate from each other. The reflective structure 730 remains square-shaped, but the arrangement of the first region M1 and the second region M2 is changed to a diagonal arrangement, in which the first region M1 divides the second region M2 into an upper-left area and a lower-right area separate from each other. The reflective structure 740 is diamond-shaped, and the first region M1 and the second region M2 are arranged such that the first region M1 is surrounded by the second region M2. The reflective structure 750 is also diamond-shaped, and the arrangement of the first region M1 and the second region M2 is changed to a horizontal arrangement, in which the first region M1 divides the second region M2 into a left area and a right area separate from each other. The reflective structure 760 is also diamond-shaped, and the arrangement of the first region M1 and the second region M2 is changed to a slant arrangement, in which the first region M1 divides the second region M2 into an upper-left area and a lower-right area separate from each other. The reflective structure 770 is hexagonal-shaped, and the first region M1 and the second region M2 are arranged such that the first region M1 is surrounded by the second region M2. The reflective structure 780 is also hexagonal-shaped, and the arrangement of the first region M1 and the second region M2 is changed to a horizontal arrangement, in which the first region M1 divides the second region M2 into a left area and a right area separate from each other. The reflective structure 790 is also hexagonal-shaped, and the arrangement of the first region M1 and the second region M2 is changed to a vertical arrangement, in which the first region M1 divides the second region M2 into an upper area and a lower area separate from each other. In certain embodiments, the reflective structure may also be in other shapes, such as a rectangular shape, or any other shape.

As discussed above, in each of the reflective structures, the first reflective ratio of the first region M1 is greater than the second reflective ratio of the second region M2, such that the first reflective ratio of the respective pixel corresponding to the first region is greater than the second reflective ratio of the respective pixel corresponding to the second region. In certain embodiments, the first region M1 and the second region M2 may be formed with a same reflective material and have different thicknesses such that the reflective ratios of the first region M1 and the second region M2 vary due to the different thicknesses. Generally, the reflective ratio of the reflective structure increases when the thickness of the reflective structure increases. In this case, a first thickness of the first region M1 may be greater than a second thickness of the second region M2, such that the first reflective ratio of the first region M1 is greater than the second reflective ratio of the second region M2. In certain embodiments, the reflective material may be a metal material selected from Ag, Al, Mg and Mo.

In certain embodiments, the first region M1 and the second region M2 may be formed with different reflective materials and have a same thickness. Since different reflective materials may have different reflective ratios, the material being used in the first region M1 may be a material with a higher reflective ratio, such that the first reflective ratio of the first region M1 is greater than the second reflective ratio of the second region M2. In certain embodiments, the reflective materials may be a metal material selected from Ag, Al, Mg and Mo.

Figure 8:
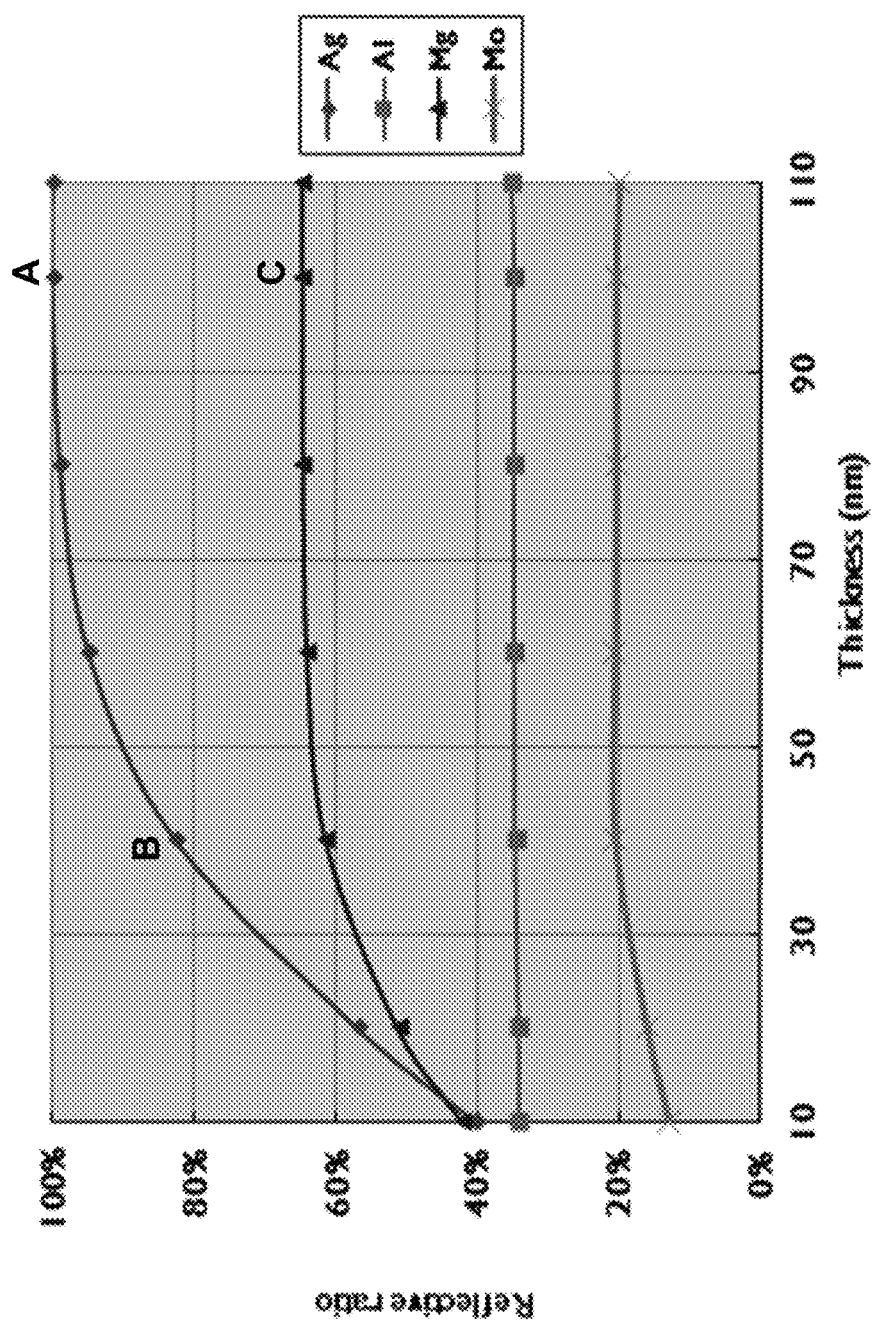
FIG. 8 shows the reflective ratio to thickness relationships of different reflective materials as the reflective structure in a blue (B) pixel according to certain embodiments of the present disclosure.

FIG. 8 shows the reflective ratio to thickness relationships of different reflective materials as the reflective structure in a blue (B) pixel according to certain embodiments of the present disclosure. Correspondingly, Table 1 shows a list of examples of the ratios in different arrangement of the reflective structures in the blue (B) pixels according to certain embodiments of the disclosure. It should be noted that the ratios of the reflective structures in the pixels of the same color should be the same. For example, the ratios of the reflective structures in the blue (B) pixels are the same. However, for the pixels of different colors, the ratios of the reflective structures may be the same or may be different. For example, the ratios of the reflective structures in the blue (B) pixels may be different from the ratios of the reflective structures in the green (G) pixels.

Specifically, in Example 1, the reflective structure is not divided into multiple regions (thus the area ratio of M1 being 100%), which is similar to the structure as shown in FIG. 4A. In Examples 2 and 3, the reflective structure is divided into two regions M1 and M2, where the first area ratio of the first region M1 is 80% and the second area ratio of the second region M2 is 20%. In all cases, the reflective material used for the first region M1 is Ag, and the thickness of the first region M1 is 100 nm. Thus, the reflective ratio of the first region M1 is 100% (point A in FIG. 8). Accordingly, in Example 1, the total reflective ratio (which is the sum of the product of the area ratio and the reflective ratio) is 100%. In Example 2, the reflective material used for the second region M2 is also Ag, and the thickness of the second region M2 is 40 nm. Thus, the reflective ratio of the second region M2 is 83% (point B in FIG. 8). Accordingly, in Example 2, the total reflective ratio (which is the sum of the product of the area ratio and the reflective ratio) is 96.6% (=80%*100%+ 20%*83%). In Example 3, the reflective material used for the second region M2 is Mg (which is less reflective), and the thickness of the second region M2 remains 100 nm. Thus, the reflective ratio of the second region M2 is 65% (point C in FIG. 8). Accordingly, in Example 3, the total reflective ratio (which is the sum of the product of the area ratio and the reflective ratio) is 93% (=80%*100%+ 20%*65%).

Further, as shown in FIG. 8, for each of the reflective materials, the reflective ratio thereof reaches a stabilized value when the thickness of each reflective material is over 100 nm, and a substantial drop of the reflective ratio thereof can be observed when the thickness of each reflective material is under 40 nm (particularly in the case of Ag, Mg and Mo). Therefore, in certain embodiments, the thickness of the first region M1 is set to be less than or equal to 100 nm and greater than or equal to 40 nm, such that each reflective structure can be relatively thin without sacrificing the reflective ratio thereof,

TABLE 1

| Examples | Area Ratio (%) | | Thickness (nm) | | Reflective Ratio (%) | | Total Reflective Ratio (%) |
| --- | --- | --- | --- | --- | --- | --- | --- |
| | M1 | M2 | M1 | M2 | M1 | M2 | |
| Example 1 | 100% | 0% | 100 | 0 | 100 | 0 | 100% |
| Example 2 | 80% | 20% | 100 | 40 | 100 | 83 | 96.6% |
| Example 3 | 80% | 20% | 100 | 100 | 100 | 65 | 93% |

It should be noted that, in a hypothetical example, the material used for the second region M2 can be a non-reflective material, which has the reflective ratio of 0%. In this case, the total reflective ratio (which is the sum of the product of the area ratio and the reflective ratio) is 80% (=80%*100%+20%*0%). Since the reflective material being used for the second region M2 is generally a reflective material having the reflective ratio greater than 0%, the total reflective ratio should be generally greater than 80%. In certain embodiments, for each of the reflective structures, the difference between the first reflective ratio of the first region M1 and the second reflective ratio of the second region M2 should be greater than or equal to 1%, such that human eyes can recognize the difference thereof.

Further, in each of the examples as shown in Table 1, the reflective ratio of the second region M2 is less than 100%. In certain embodiments, the reflective ratio of the second region M2 should be no greater than 99% (i.e., at least 1% less than the reflective ratio of the first region M1), such that the reflective ratios of the first region M1 and second region M2 is differentiated for human eyes to distinguish the corresponding differences in the emission luminance thereof.

Figure 9:
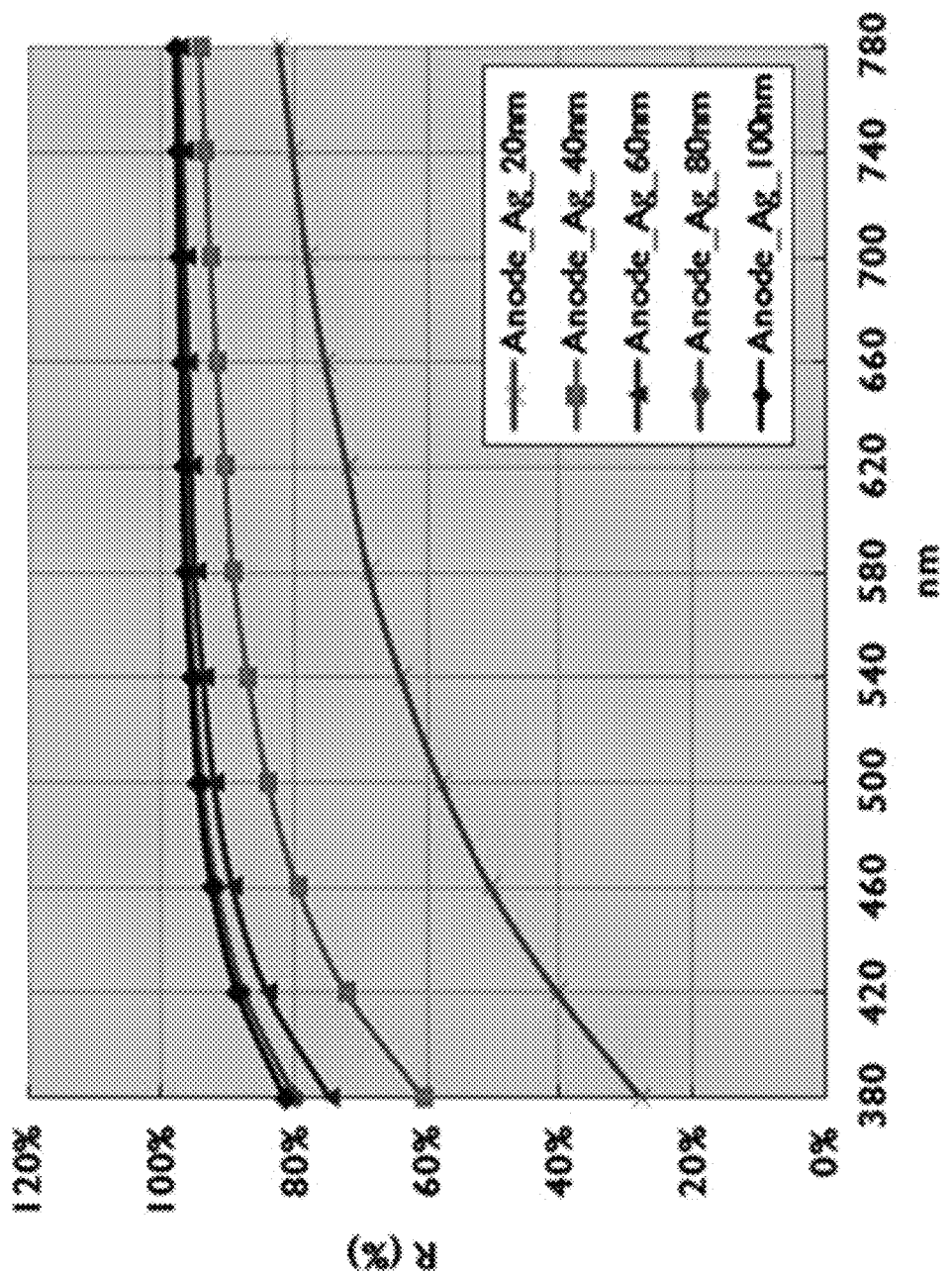
FIG. 9 shows the absolute reflective ratio to light wavelength relationships of Ag as the reflective material of the reflective structure with different thickness according to certain embodiments of the present disclosure.

FIG. 9 shows the absolute reflective ratio to light wavelength relationships of Ag as the reflective material of the reflective structure with different thickness according to certain embodiments of the present disclosure. Correspondingly, Table 2 shows a list of the ratios of the structure in Example 1 (M1 100% area ratio) in a blue (B) pixel (460 nm wavelength), where the reflective material is Ag with different thickness according to certain embodiments of the disclosure. As shown in FIG. 9, when the thickness of the Ag layer increases, the absolute reflective ratio R % of the reflective structure correspondingly increases. It should be noted that a difference exists in the absolute (actual) reflective ratio and the relative reflective ratio.

TABLE 2

| Thickness (A) | M1 Area Ratio (%) | M2 Area Ratio (%) | Absolute Reflective Ratio (%) | Relative Reflective Ratio (%) |
| --- | --- | --- | --- | --- |
| Ag 100 nm | 100% | 0% | 93% | 100% |
| Ag 80 nm | 100% | 0% | 92% | 99% |
| Ag 60 nm | 100% | 0% | 87% | 95% |
| Ag 40 nm | 100% | 0% | 73% | 83% |
| Ag 20 nm | 100% | 0% | 41% | 57% |

In the examples as shown in Table 1 and Table 2, the absolute reflective ratio of Ag refers to the actual reflective ratio of Ag in the specific thickness, and the relative reflective ratio is a normalized ratio calculated using the absolute reflective ratio (i.e., the actual reflective ratio) of Ag having a thickness of 100 nm as the basis. Specifically, the relative reflective ratio of the first region M1 is 100% when the thickness of the first region M1 is set as 100 nm. In certain embodiments, the thickness of each of the reflective structures is set to be 80 nm, such that the relative reflective ratio (99%) and the corresponding absolute reflective ratio (92%) remain relatively high. In certain embodiments, the thickness of each of the reflective structures may be less than 80 nm. As discussed above, in certain embodiments, the thickness of the first region M1 can be set to be less than or equal to 100 nm and greater than or equal to 40 nm.

Figure 10:
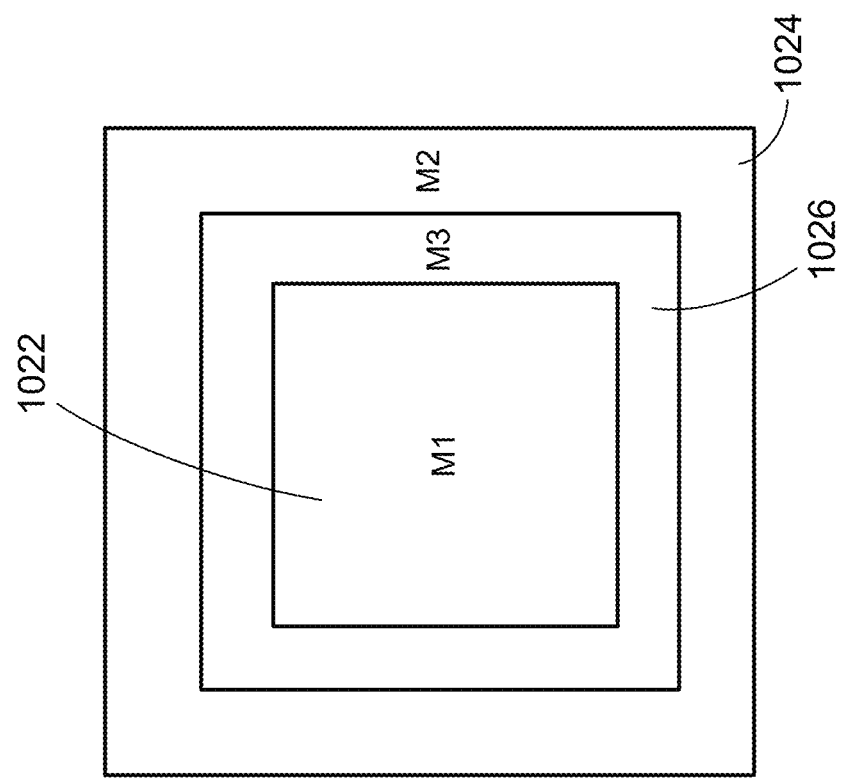
FIG. 10 schematically shows a top view of a reflective structure having three regions according to certain embodiments of the present disclosure.

In the embodiments as discussed above, the reflective structure has two regions, including a first region M1 and M2. In certain embodiments, additional regions may be added such that the reflective structure has more than two regions. For example, FIG. 10 schematically shows a top view of a reflective structure having three regions according to certain embodiments of the present disclosure. As shown in FIG. 10, the reflective structure 1000 is substantively a square-shaped structure, which is divided into three regions, including a first region (M1) 1022, a second region (M2) 1024 surrounding the first region M1, and a third region (M3) 1026 between the first region M1 and the second region M2. The area ratios of the first region M1, the second region M2 and the third region M3 may be corresponding adjusted. In certain embodiments, a third reflective ratio of the reflective structure 1000 corresponding to the third region M3 is greater than the second reflective ratio of the reflective structure 1000 corresponding to the second region M2 and less than the first reflective ratio of the reflective structure 1000 corresponding to the first region M1. In certain embodiments, the reflective structure can be divided into more than three regions, and details of these embodiments are not elaborated herein.

In certain embodiments, the OLED display panel as discussed may be used to achieve higher resolution. For example, the resolution of the OLED display panel may be greater than 600 ppi. Further, the OLED display panel as discussed may be utilized in any device that requires higher resolution, such as a VR device.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An organic light emitting diode (OLED) display panel, comprising:
    a substrate;
    a reflective electrode layer disposed on the substrate and having a plurality of reflective structures, wherein each of the reflective structures has a first region and a second region;
    a pixel define layer (PDL) formed on the substrate and the reflective electrode layer, wherein the PDL is provided with a plurality of openings corresponding to the reflective structures, such that the first region and the second region of each of the reflective structures are exposed in a corresponding one of the openings; and
    a plurality of organic emissive structures correspondingly formed in the openings and covering the reflective structures, forming a plurality of pixels,
    wherein for each respective pixel of the pixels, a first reflective ratio of the respective pixel corresponding to the first region is greater than a second reflective ratio of the respective pixel corresponding to the second region.

2. The OLED display panel according to claim 1, having a total reflective ratio greater than or equal to 80%.

3. The OLED display panel according to claim 1, wherein a first area ratio of the first region is X of a total area of each of the reflective structures, a second area ratio of the second region is (1-X) of the total area of each of the reflective structures, and X is greater than or equal to 80% and less than or equal to 99%.

4. The OLED display panel according to claim 1, wherein for each of the reflective structures, a difference between the first reflective ratio of the first region and the second reflective ratio of the second region is greater than or equal to 1%.

5. The OLED display panel according to claim 4, wherein for each of the reflective structures, the first region and the second region are formed with a same material and have different thicknesses, such that the first reflective ratio of the first region is greater than the second reflective ratio of the second region.

6. The OLED display panel according to claim 5, wherein the material is selected from a group consisting of Ag, Al, Mg and Mo, and a first thickness of the first region is greater than a second thickness of the second region.

7. The OLED display panel according to claim 4, wherein for each of the reflective structures, the first region and the second region are formed with different materials and have a same thickness, such that the first reflective ratio of the first region is greater than the second reflective ratio of the second region.

8. The OLED display panel according to claim 7, wherein each of the different materials is selected from a group consisting of Ag, Al, Mg and Mo.

9. The OLED display panel according to claim 1, wherein the first region is surrounded by the second region.

10. The OLED display panel according to claim 1, wherein the second region is divided into two separate areas by the first region.

11. The OLED display panel according to claim 1, wherein a thickness of each of the reflective structures is less than or equal to 100 nm.

12. The OLED display panel according to claim 1, wherein for each of the reflective structures, a thickness of the first region is less than or equal to 100 nm and greater than or equal to 40 nm.

13. The OLED display panel according to claim 1, wherein each of the reflective structures further has a third region between the first region and the second region, and for each respective pixel of the pixels, a third reflective ratio of the respective pixel corresponding to the third region is greater than the second reflective ratio and less than the first reflective ratio.

14. The OLED display panel according to claim 1, having a resolution greater than 600 pixels per inch (ppi).

15. The OLED display panel according to claim 1, wherein the reflective structures in function as anodes of the pixels, and each of the reflective structures is respectively covered and sandwiched by two transparent layers.

16. The OLED display panel according to claim 15, wherein the transparent layers are indium tin oxide (ITO) layers.

17. A device having the OLED display panel according to claim 1.

18. The device according to claim 17, being a virtual reality (VR) device.

* * * * *